Dec. 13, 1960 F. H. SHEPARD, JR 2,964,713

AUDIO AUTOMATIC VOLUME CONTROL

Original Filed June 13, 1952

INVENTOR.
FRANCIS H. SHEPARD JR.

BY

Curtis, Morris & Safford
ATTORNEYS.

2,964,713

AUDIO AUTOMATIC VOLUME CONTROL

Francis H. Shepard, Jr., Lee Lane, Berkeley Heights, N.J.

Continuation of application Ser. No. 293,238, June 13, 1952. This application Mar. 7, 1958, Ser. No. 719,874

5 Claims. (Cl. 330—135)

My invention relates to an audio automatic volume control and more particularly to an amplifier for audio signals in which the output signal is automatically controlled as to its amplitude, irrespective of the amplitude of the incoming audio signal.

In cases where there is a carrier, volume has been controlled by rectifying a portion of the output energy and employing the rectified output energy to control the bias of the initial tubes of the amplifier. Since a thermionic tube, however, is not a linear device, if this is attempted with audio signals, distortion is produced so this mode of proceeding cannot be employed.

One object of my invention is to provide an audio amplifier in which the output signal will remain at a predetermined level irrespective of the ampliude of the incoming signal.

Another object of my invention is to provide an audio amplifier which will automatically increase its gain when the incoming signal is low so that the output signal will be amplified to a predetermined level.

Another object of my invention is to provide an audio amplifier which will decrease its gain when the amplitude of the incoming signal is high in order that the output signal will be amplified to a predetermined level.

Another object of my invention is to provide an audio amplifier in which the level of the output signal may be set and which will automatically maintain the output level irrespective of the amplitude of incoming signals.

Other and further objects of my invention will appear from the following description.

In the accompanying drawings which form part of the instant specification and which are to be read in conjunction therewith and in which like reference numerals are used to indicate like parts in the various views.

Figures 1, 2:
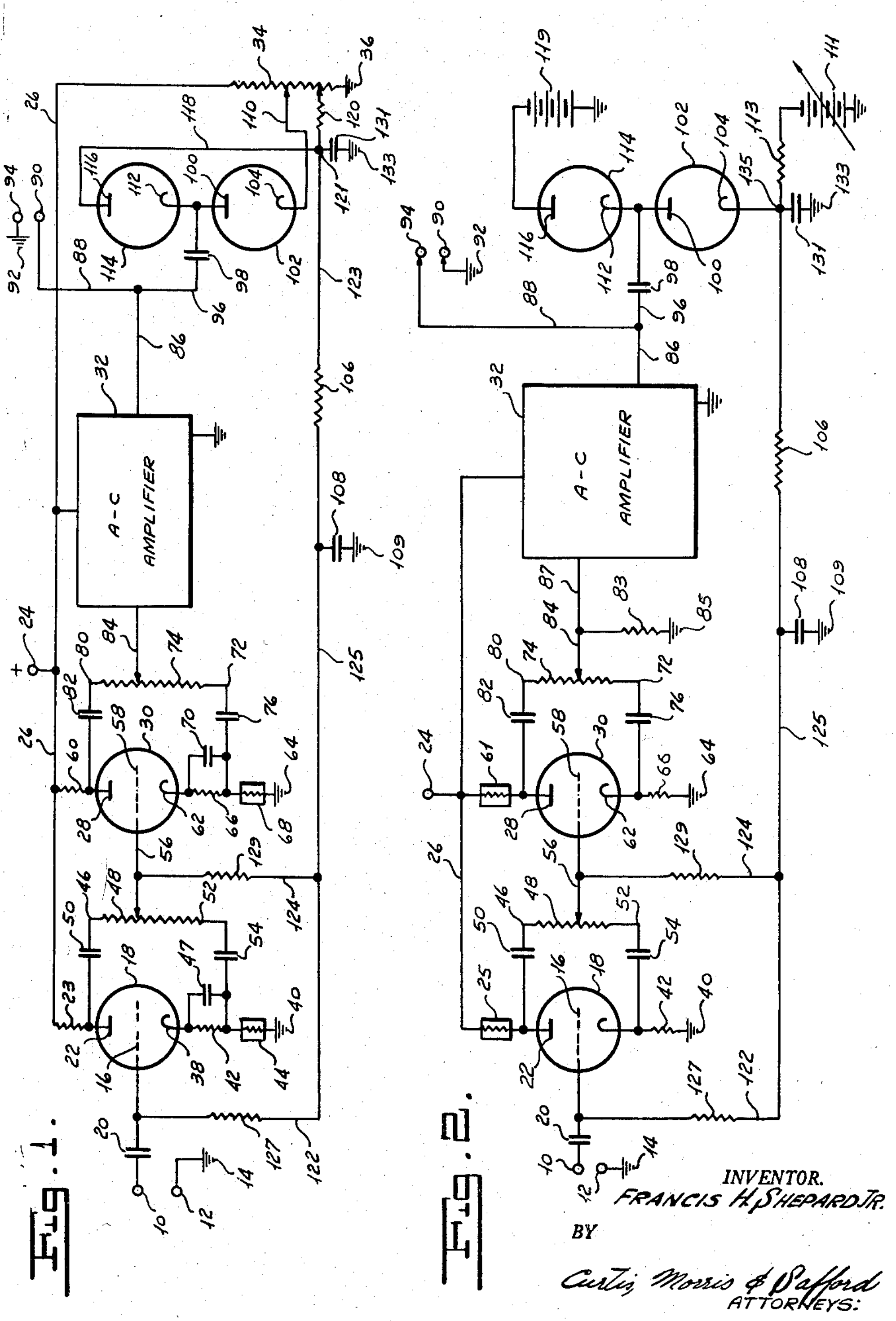
Figure 1 is a diagrammatic view of an audio amplifier containing one embodiment of my invention.
Figure 2 is a diagrammatic view showing another circuit embodying my invention.

Referring now to Figure 1, the input signal is impressed across terminals 10 and 12. Terminal 12 is connected to ground 14 and terminal 10 is connected to the grid 16 of a thermionic tube 18 through a capacitor 20. The anode 22 of the tube 18 is connected to a positive potential source 24 through a conductor 26 and a resistor 23. The conductor 26 furnishes B voltage to the anode 28 of a thermionic tube 30 and to the A.C. amplifier indicated diagrammatically by the reference numeral 32. The conductor 26 is also connected to ground 36 through a potentiometer resistor 34, the purpose of which will be pointed out more fully hereinafter.

The cathode 38 of the tube 18 is connected to ground 40 through a current-limiting resistor 42 and a thermistor 44. The resistor 42 is shunted by a capacitor 47 to bypass transients. The thermistor 44 may be of any suitable type. It is a resistor whose value varies with temperature and is such as to have a negative temperature coefficient of resistance. That is to say the thermistor is such that as the current passing through it increases, the heat represented by $I^2R$ reduces the resistance of the resistor. At room temperature the resistance has a predetermined value. As the temperature of the thermistor increases due to the current passing through it, the increase in temperature reduces the resistance rapidly. These thermistors are well known to the art and form no part of the instant invention. They are usually made of semiconducting materials such as uranium oxide or silver sulphide.

The plate 22 of the thermionic tube 18 is connected to one end 46 of a resistor 48 through a D.C. isolating capacitor 50. The lower end of the cathode resistor 42 is conected to the other end 52 of the resistor 48 through a capacitor 54. The output signal of the tube 18 appears between conductor 56 and ground. The signal between plate and ground, that is, between point 46 and ground, is 180° out of phase from that which appears between cathode and ground, that is, between point 52 and ground. The conductor 56 makes variable contact with the resistor 48. It is possible by the adjustment of the variable contact of conductor 56 to attenuate the output signal in conductor 56 to zero. It is also possible by moving the contact of conductor 56 upwardly along resistor 48 to increase the amplitude of the output signal by varying the balancing effect of the cathode to ground signal, that is, by decreasing it. Similarly, by moving the conductor 56 downwardly we may change the signal between conductor 56 and ground in phase and also control the amplitude of the output signal. I provide this arrangement so that the gain experienced by the signal in passing through tube 18 may be readily adjusted and controlled to a predetermined figure.

The output of tube 18 is impressed upon the grid 58 of the thermionic tube 30 through the conductor 56. The anode 28 of the tube 30 is connected to the positive potential terminal 24 through conductor 26 and the anode resistor 60. The cathode 62 of the tube 30 is connected to ground 64 through a cathode resistor 66 and a thermistor 68. The resistor 66 is shunted by a by-pass condenser 70. The lower end of the cathode resistor 66 is connected to the lower end 72 of a resistor 74 through a capacitor 76. The anode 28 of the tube 30 is connected to the upper end 80 of the resistor 74 through a capacitor 82. The output of thermionic tube 30 is impressed through conductor 84 to the input of an A.C. amplifier 32 which may have any convenient number of amplification stages depending on the over-all gain desired. The output of the A.C. amplifier is led by conductor 86 and conductor 88 to a terminal 90 between which and ground 92, which is connected to terminal 94, the output of the amplifier is removed. Part of the output signal, however, is impressed by conductor 96 and capacitor 98 upon the anode 100 of a diode 102. The anode 100 is connected to the cathode 112 of a second diode 114. The diodes 114 and 102 are automatic volume control diodes. The cathode 104 of the diode 102 is connected by conductor 110 to a point on the potentiometer resistor 34. This determines the delay bias of the AVC (automatic volume control) diodes and the output level of the amplifier. The plate 116 of the diode 114 is connected by conductor 118 and a load resistor 120 to another point on the potentiometer resistor 120 to another point on the potentiometer resistor 34 which is more negative than the point at which the conductor 110 is connected. The arrangement is such that when the delay bias is exceeded by the output signal, tube 102 will conduct, thus charging capacitor 98 negatively. This negative charge will permit tube 114 to conduct, making the left-hand end of load resistor 120 less positive than its original value. It will be seen that the left-hand end 121 of load resistor 120 is connected by conductor 123 to the resistor 106 to conductor 125 which is the AVC line. Normally this line is at the potential of the connection of load resistor 120 to the potentiometer resistor 34 and biases grid 16 of tube 18 through conductor 122 and resistor 127 to a predetermined positive potential. In the same manner grid 58 of tube 30 is biased to a predetermined positive potential through conductor 124 and resistor 129. Resistors 127 and 129 are high enough in value to isolate the audio signal from ground. The capacitor 108 and the capacitor 131 connected respectively to ground 109 and ground 133 provide filters of A.C. components to ground.

In the form shown in Figure 1 conductor 56 is connected to resistor 48 on the positive side of balance. In the same manner conductor 84 is connected to resistor 74 on the positive side of balance. When the tube 18 conducts, the temperature due to current through the thermistor 44 reduces the resistance of the thermistor. This reduction in resistance upsets the balance of the bridge in a direction to increase the gain of tube 18. The conductor 84 is similarly connected to the bridge resistor 74 on the positive side of balance so that the opposing effect of the cathode part of the bridge of which the thermistor forms part is reduced when the resistance of the thermistor 68 is reduced. It will be seen, therefore, that as the D.C. voltage applied to the grids 16 and 58 is increased due to the increase in current through the thermistors 44 and 68 respectively, the gain through tubes 18 and 30 tends to increase. When the gain through these tubes increases to a point so that the output signal overcomes the delay bias upon cathode 104 the AVC tubes will conduct. The change in potential across the load resistor 120 thus reduces the bias potential upon grids 16 and 58. This reduces the current being conducted by tube 18 and the current conducted by tube 30. This reduction in the current increases the resistance of the thermistors 44 and 68 respectively, thus in effect changing the balance of the resistance bridge network to reduce the gain through the tubes 18 and 30. It will be observed that I do not rely upon the change of bias on the grids 16 and 58 directly to change the gain through the tubes and their associated networks. Instead, the change in grid bias on the tubes 18 and 30 controls their transconductance so that the resistance value of the thermistor is brought to its proper value to adjust the bridge network to give the desired gain. It will be seen that a sudden increase in output will result in decreasing the current through the thermistors 44 and 68, thus permitting their resistances to increase thereby changing the balance of the network to decrease the gain. Conversely, an increase in the current through the thermistors reduces their resistances and changes the balance of the bridge network to increase the gain through the tubes and their respective associated resistance bridges.

Referring now to Figure 2, the resistance bridges and arrangements are the same as that shown in Figure 1. The thermistors, however, are placed in series with the respective plates instead of in series with the respective cathodes. Thermistors 44 and 68 are eliminated and only the current-limiting cathode resistors 42 and 66 are employed connected directly to ground 40 and ground 64 respectively. Instead, I employ a thermistor 25 connecting the plate voltage conductor 26 to the plate 16 of the tube 18, and a thermistor 61 connecting the positive potential source 24 to the plate 28. In this case, however, the conductor 56 is connected to the resistor 48 at the negative side of balance. Similarly, the conductor 84 is connected to resistor 74 at the negative side of balance. A battery 119 has its negative terminal connected to plate 116 of the diode 114 to provide a delay bias. A battery 111 is connected through a load resistor 113 to the cathode 104 of the diode 102 to provide an initial bias adjustment. The filter capacitors 131 to ground 133 and 108 to ground 109 are employed as before. The AVC line 125 in this case places a negative bias upon the grids 16 and 58 through conductors 122 and 124. The arrangement in Figure 2 is such that when the resistance of thermistor 25 is at a maximum we have maximum gain through tube 18 and its associated resistance bridge network and when the resistance of the thermistor 25 decreases, the gain through tube 18 is decreased. Similarly, when the thermistor 61 has maximum resistance the gain through tube 30 is at a maximum. The level of the signal which is desired is determined by the delay bias. When the output signal exceeds the delay bias the AVC diodes 114 and 102 will conduct. This results in making the point 135 at the left-hand end of load resistor 113 less negative, that is, more positive. Accordingly, the negative bias upon grids 16 and 58 will be reduced. This permits more current to flow through the plate to cathode circuits of tubes 18 and 30 and hence through thermistors 25 and 61 respectively. As current flows through the thermistors 25 and 61 their resistances will decrease due to the negative coefficient of resistance characteristics of the thermistors. The decrease in the thermistor resistances will change the balance of the resistance bridges to decrease the gain through respective tubes 18 and 30. It will be seen that again I do not rely upon the change of bias on grids 16 and 58 to control the volume of the output signal. I could not do this with audio signals since the change would be non-linear and thus produce distortion. Instead, I rely on changing the resistance through the tube to control the current passing through the thermistors to alter the bridge balance to give me the desired control over gain through the tubes. The initial bias adjustment determined by the voltage of the battery 111 and the initial adjustment of the connection of conductor 56 with bridge resistor 48 and of the connection of conductor 84 with bridge resistor 74 determine the maximum gain through my amplifier. When the output level as determined by the delay bias potential 119 is exceeded, the grid bias is made less negative, that is, more positive. When this occurs there is an increase in current through the thermistors 25 and 61. This increase in current reduces the resistance of the thermistors and changes the balance of the bridge toward the positive, thus reducing the gain through the tubes 18 and 30, it being remembered that the initial adjustment was on the negative side of balance. The effect, therefore, of reducing the resistance of the thermistors 25 and 61 is the same as moving the conductors 56 and 84 respectively from the negative side of balance toward balance. It is to be understood, of course, that at balance we have substantially complete attenuation.

In Figure 2 the output signal of the tube 30 appears across the resistor 83 which is connected between conductor 84 and ground 85. This signal is led by conductor 87 to the A.C. amplifier 32.

Both embodiments of my invention are operative, but the form shown in Figure 1 is preferred since it is easier to increase the temperature of the thermistor quickly and reduce its resistance than it is to reduce the temperature of the thermistor quickly to increase its resistance. My volume control will operate on audio signals without distortion. I am enabled to obtain a compartively level output even though the input comprises a whisper or a shout. My amplifier, therefore, is of especial utility and advantage in all cases where a level, constant output is desired, irrespective of input, as for example in telephone systems and telephone recording systems. In a telephone answering service, for example, in which messages are recorded the caller may shout or whisper or change the amplitude of this voice, giving a record which frequently is unintelligible. With my amplifier excellent records can be obtained. The level of the output signal can be easily adjusted by adjusting the delay bias, in the case of Figure 1, by the variable arm 110. In the case of Figure 2 the adjustment can be achieved easily by changing the delay bias potential 119.

It will be seen that I have accomplished the objects of my invention. I have provided an audio amplifier in which the output signal will remain at a predetermined level irrespective of the amplitude of the incoming signal and which will automatically increase its gain when the incoming signal is low and decrease its gain when the incoming signal is higher than desired. I have provided an audio automatic volume control which will maintain a predetermined level of output signal without distortion irrespective of the amplitude of the incoming signals.

It will be understood that certain features and subcombinations are of utility and may be employed without reference to other features and subcombinations. This is contemplated by and is within the scope of my claims. It is further obvious that various changes may be made in details within the scope of my claims without departing from the spirit of my invention. It is therefore to be understood that my invention is not to be limited to the specific details shown and described.

This application is a continuation of co-pending U.S. patent application Serial No. 293,238, filed June 13, 1952, now abandoned.

Having thus described my invention, what I claim is:

1. A distortion-free volume control circuit for audio signals and the like, said circuit comprising a signal amplifying variable current conducting element having a control electrode, and two output electrodes, a temperature variable resistor connected to one of said output electrodes and a second resistor connected to the other of said output electrodes, said resistors and element being connected in series with a voltage source, and an ungrounded three terminal resistor connected across said output electrodes the center terminal of said three terminal resistor being the output terminal of said circuit, and the control electrode of said element being the input terminal, and external means to control the D.C. bias of said control electrode, said resistors being proportioned so that a small change in the D.C. bias applied to said control electrode will cause a large change in the A.C. gain from the input to the output terminal of said circuit, but the amplification of said signals at various gain levels will be distortion free.

2. The circuit as in claim 1 wherein the input terminal of a second circuit of the same kind is connected to the output terminal of said first circuit, and said external means to control the D.C. bias of said control electrode includes a feedback loop with a rectifier, said loop being connected between the output terminal of said second circuit and said control electrode.

3. A distortion-free A.C. signal volume control circuit comprising: a signal amplifying variable current conducting element having two output electrodes and a control electrode, a D.C. power source, a temperature variable resistor, said resistor and said output electrodes being connected in series across said source, an input terminal connected to said control electrode, there being a first A.C. signal point of one polarity at the junction of said temperature variable resistor with one of said output electrodes, there being a second A.C. signal point of opposite polarity at another one of said electrodes, ungrounded three terminal resistor means having two outer terminals and an intermediate terminal, one of said two outer terminals being connected to one of said two points, and the other outer terminal being connected to the other of said two points, the intermediate terminal of said resistor means comprising the output terminal of said circuit, and external means to control the D.C. bias of said control electrode thereby to control the direct current through said temperature variable resistor, whereby a small change in said D.C. bias will cause a large change in the A.C. gain from said input to said output terminal but said A.C. signal will not be distorted with changes in gain.

4. A distortion-free audio volume control circuit comprising a vacuum tube having a grid, a plate and a cathode, a temperature variable resistor connected to one of said plate and cathode, and a second resistor connected to the other of said plate and cathode, said resistors and tube being connected in series with a direct voltage source, and a bridge resistor connected between said plate and cathode, said bridge resistor being ungrounded and having a center terminal which is the output terminal of said circuit, the grid of said tube being the input terminal of said circuit, and external means to control the D.C. bias of said grid, whereby a small change in the D.C. bias applied to said grid will cause a large change in the audio gain from the input to the output terminal of said circuit, but the amplification of audio signals at various gain levels will be effectively distortion free.

5. The circuit as in claim 4 wherein said bridge resistor is a potentiometer whose slider comprises said center terminal.

References Cited in the file of this patent

UNITED STATES PATENTS

| | | |
|---|---|---|
| 2,284,102 | Rosencrans | May 26, 1942 |
| 2,307,308 | Sorensen | Jan. 5, 1943 |
| 2,441,334 | Sayer | May 11, 1948 |
| 2,468,082 | Chatterjea et al. | Apr. 26, 1949 |
| 2,558,519 | Hill | June 26, 1951 |
| 2,559,587 | Black | July 10, 1951 |